United States Patent
Patel (10) Patent No.: US 12,316,199 B1
(45) Date of Patent: May 27, 2025

(54) WASTE ENERGY RECLAMATION WITH DAMPERS

(71) Applicant: Core Scientific Operating Company, Bellevue, WA (US)

(72) Inventor: Harsh Patel, Stone Mountain, GA (US)

(73) Assignee: Core Scientific, Inc., Austin, TX (US)

( * ) Notice: Subject to any disclaimer, the term of this patent is extended or adjusted under 35 U.S.C. 154(b) by 59 days.

(21) Appl. No.: 17/741,544

(22) Filed: May 11, 2022

Related U.S. Application Data (60) Provisional application No. 63/187,478, filed on May 12, 2021.

(51) Int. Cl.
| | |
|---|---|
| H02K 7/18 | (2006.01) |
| H05K 7/14 | (2006.01) |
| H05K 7/20 | (2006.01) |

(52) U.S. Cl.
CPC ........... H02K 7/183 (2013.01); H05K 7/1489 (2013.01); H05K 7/20709 (2013.01)

(58) Field of Classification Search
CPC ... H02K 7/183; H05K 7/1489; H05K 7/20709
See application file for complete search history.

(56) References Cited

U.S. PATENT DOCUMENTS

| | | | | |
|---|---|---|---|---|
| 9,485,887 | B1* | 11/2016 | Eichelberg | H05K 7/20536 |
| 2017/0042067 | A1* | 2/2017 | Parizeau | H05K 7/2079 |
| 2019/0373779 | A1* | 12/2019 | Roy | H05K 7/20145 |
| 2020/0248667 | A1* | 8/2020 | Chang | H05K 7/20745 |
| 2021/0014997 | A1* | 1/2021 | Johnson | F24F 7/013 |

FOREIGN PATENT DOCUMENTS

WO    WO-2020227811 A1 * 11/2020 ............. G05B 15/02

* cited by examiner

*Primary Examiner* — Viet P Nguyen
(74) *Attorney, Agent, or Firm* — Fishman Stewart PLLC (57) ABSTRACT

A system for the reclamation of energy generated from computing devices disposed within a data center may include at least one rack, an exhaust duct, and a damper. The at least one rack may include a plurality of computing devices. The exhaust duct may be disposed adjacent to the at least one rack and may be configured to receive exhaust air from the computing devices. The damper may be disposed within the exhaust duct and may be configured to release at least some of the exhaust air into the data center when an ambient temperature of the data center reaches a predetermined threshold.

17 Claims, 5 Drawing Sheets

WASTE ENERGY RECLAMATION WITH DAMPERS

CROSS-REFERENCE TO RELATED APPLICATION

This application claims the benefit of and priority to U.S. Provisional Patent Application Ser. No. 63/187,478, filed on May 12, 2021, the disclosure of which is hereby incorporated by reference in its entirety as though fully set forth herein

TECHNICAL FIELD

The present disclosure generally relates to the field of computing and, more particularly, to systems and methods for the reclamation of energy generated from computing devices such as in a data center.

BACKGROUND

This background description is set forth below for the purpose of providing context only. Therefore, any aspect of this background description, to the extent that it does not otherwise qualify as prior art, is neither expressly nor impliedly admitted as prior art against the instant disclosure.

Many blockchain networks (e.g., those used for cryptocurrencies like Bitcoin) require computationally difficult problems to be solved as part of the hash calculation. The difficult problem requires a solution that is a piece of data which is difficult (costly, time-consuming) to produce, but is easy for others to verify and which satisfies certain requirements. This is often called "proof of work". A proof of work (PoW) system (or protocol, or function) is a consensus mechanism. It deters denial of service attacks and other service abuses such as spam on a network by requiring some work from the service requester, usually meaning processing time by a computer.

Participants in the network operate standard PCs, servers, or specialized computing devices called mining rigs or miners. Because of the difficulty involved and the amount of computation required, the miners are typically configured with specialized components that improve the speed at which mathematical hash functions or other calculations required for the blockchain network are performed. Examples of specialized components include application specific integrated circuits (ASICs), field programmable gate arrays (FPGAs), graphics processing units (GPUs) and accelerated processing unit (APUs).

Miners are often run for long periods of time at high frequencies that generate large amounts of heat (i.e., energy). Many participants in blockchain networks operate large numbers (e.g., 100's, 1000's or more) of different miners (e.g., different generations of miners from one manufacturer or different manufacturers) concurrently in large data centers. Many data centers housing large numbers of miners or other CPU- or GPU-based systems used for compute intensive workloads (e.g., rendering, AI, machine learning, scientific simulation, data science) generate an excessive amount of exhaust energy. Accordingly, there is an opportunity and a desire to use this generated energy for the benefit of the data center.

SUMMARY

This section provides a general summary of the disclosure, and is not a comprehensive disclosure of its full scope or all of its features.

One aspect of the disclosure provides a system for the reclamation of energy generated from computing devices disposed within a data center. The system may include at least one rack, an exhaust duct, and a damper. The at least one rack may include a plurality of computing devices. The exhaust duct may be disposed adjacent to the at least one rack and may be configured to receive exhaust air from the computing devices. The damper may be disposed within the exhaust duct and may be configured to release the exhaust air into the data center when an ambient temperature of the data center reaches a predetermined threshold.

Implementations of the disclosure may include one or more of the following optional features. In some implementations, the exhaust duct is disposed above the at least one rack. In some implementations, the exhaust duct is disposed to a side of the at least one rack.

In some implementations, a data center HVAC pipe is positioned through the exhaust duct and is configured to be heated by the exhaust air.

In some implementations, an exhaust fan is coupled to the exhaust duct and a generator. The generator may be configured to generate electricity when the exhaust air from the computing devices encounters the exhaust fan.

In some implementations, the exhaust fan is disposed at an end of the exhaust duct proximate the at least one rack. In some implementations, the exhaust fan is disposed within the exhaust duct.

Another aspect of the disclosure provides a system for the reclamation of energy generated from computing devices. The system may include at least one rack, an exhaust duct, and an exhaust fan. The at least one rack may include a plurality of computing devices. The exhaust duct may be disposed adjacent to the at least one rack and may be configured to receive exhaust air from the computing devices. The exhaust fan may be coupled to the exhaust duct and a generator. The generator may be configured to generate electricity when the exhaust air from the computing devices encounters the exhaust fan.

Implementations of this aspect of the disclosure may include one or more of the following optional features. In some implementations, the system is disposed within a data center having an ambient temperature.

In some implementations, the exhaust duct includes a damper configured to release the exhaust air into the data center when the ambient temperature of the data center reaches a predetermined threshold.

In some implementations, the exhaust duct is disposed above the at least one rack. In some implementations, the exhaust duct is disposed to a side of the at least one rack.

In some implementations, the exhaust fan is disposed at an end of the exhaust duct proximate the at least one rack. In some implementations, the exhaust fan is disposed within the exhaust duct.

In some implementations, a data center HVAC pipe is positioned through the exhaust duct and is configured to be heated by the exhaust air.

The foregoing and other aspects, features, details, utilities, and/or advantages of embodiments of the present disclosure will be apparent from reading the following description, and from reviewing the accompanying drawings.

DETAILED DESCRIPTION

Reference will now be made in detail to embodiments of the present disclosure, examples of which are described herein and illustrated in the accompanying drawings. While the present disclosure will be described in conjunction with embodiments and/or examples, it will be understood that they do not limit the present disclosure to these embodiments and/or examples. On the contrary, the present disclosure covers alternatives, modifications, and equivalents.

Various embodiments are described herein for various apparatuses, systems, and/or methods. Numerous specific details are set forth to provide a thorough understanding of the overall structure, function, manufacture, and use of the embodiments as described in the specification and illustrated in the accompanying drawings. It will be understood by those skilled in the art, however, that the embodiments may be practiced without such specific details. In other instances, well-known operations, components, and elements have not been described in detail so as not to obscure the embodiments described in the specification. Those of ordinary skill in the art will understand that the embodiments described and illustrated herein are non-limiting examples, and thus it can be appreciated that the specific structural and functional details disclosed herein may be representative and do not necessarily limit the scope of the embodiments.

Figure 1:
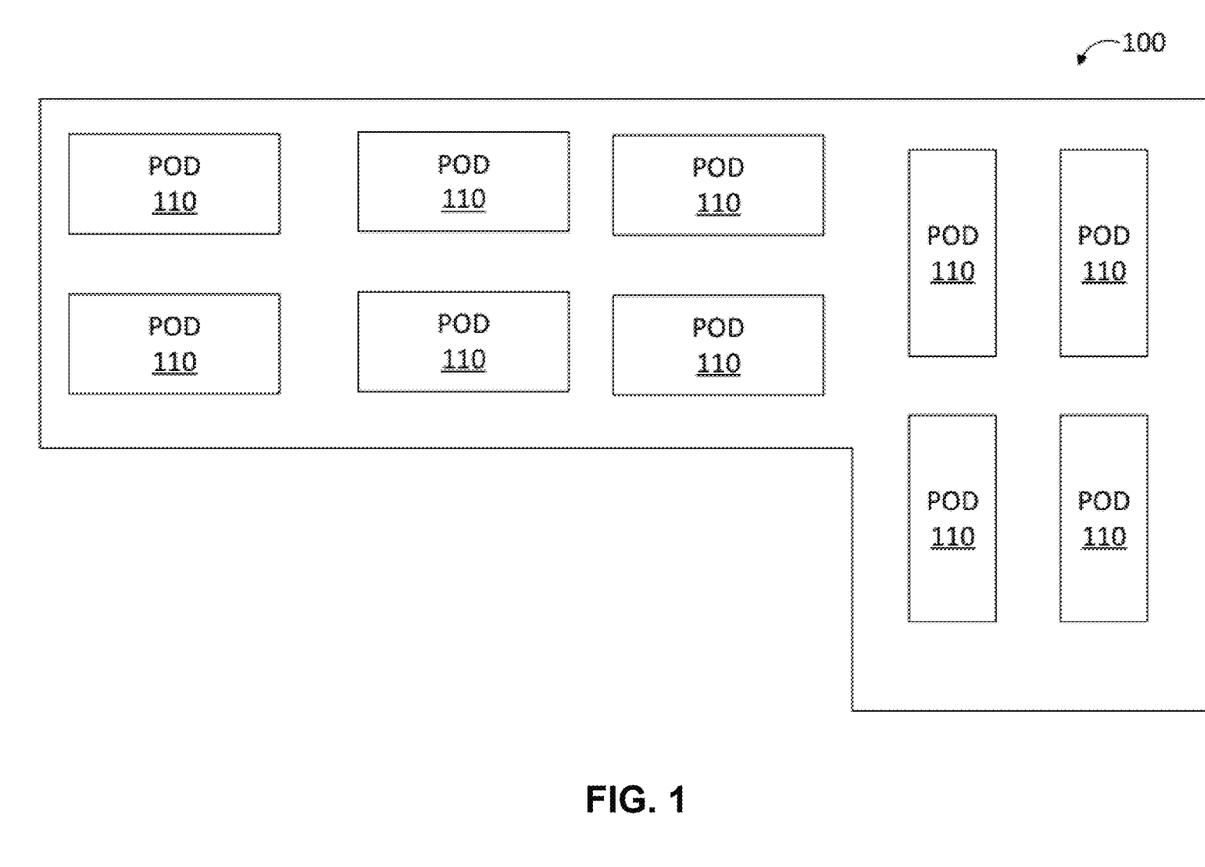
FIG. 1 is a diagram generally illustrating a top-down view of a data center for computing devices.

Referring now to FIG. 1, a top-down view of one example of a data center 100 for computing devices is shown. The data center 100 is configured with a large number of pods 110. Pods are standardized blocks of racks, either in a row or (more typically) a pair of rows that share some common infrastructure elements like power distribution units, network routers/switches, containment systems, and air handlers. For example, a pod may have two parallel racks of devices, spaced apart and each facing outwards. The devices on the racks may all be oriented to pull cool air in from outside the pod and discharge the hot air (heated by the computing devices) into the empty space in the center of the pod where the hot air then rises up and out of the data center. For example, there may be one or more exhaust openings (e.g., positioned at one end of each pod or above the center of each pod) to capture the hot waste air and then discharge it out of the data center via vents in the roof of the data center.

Figure 2:
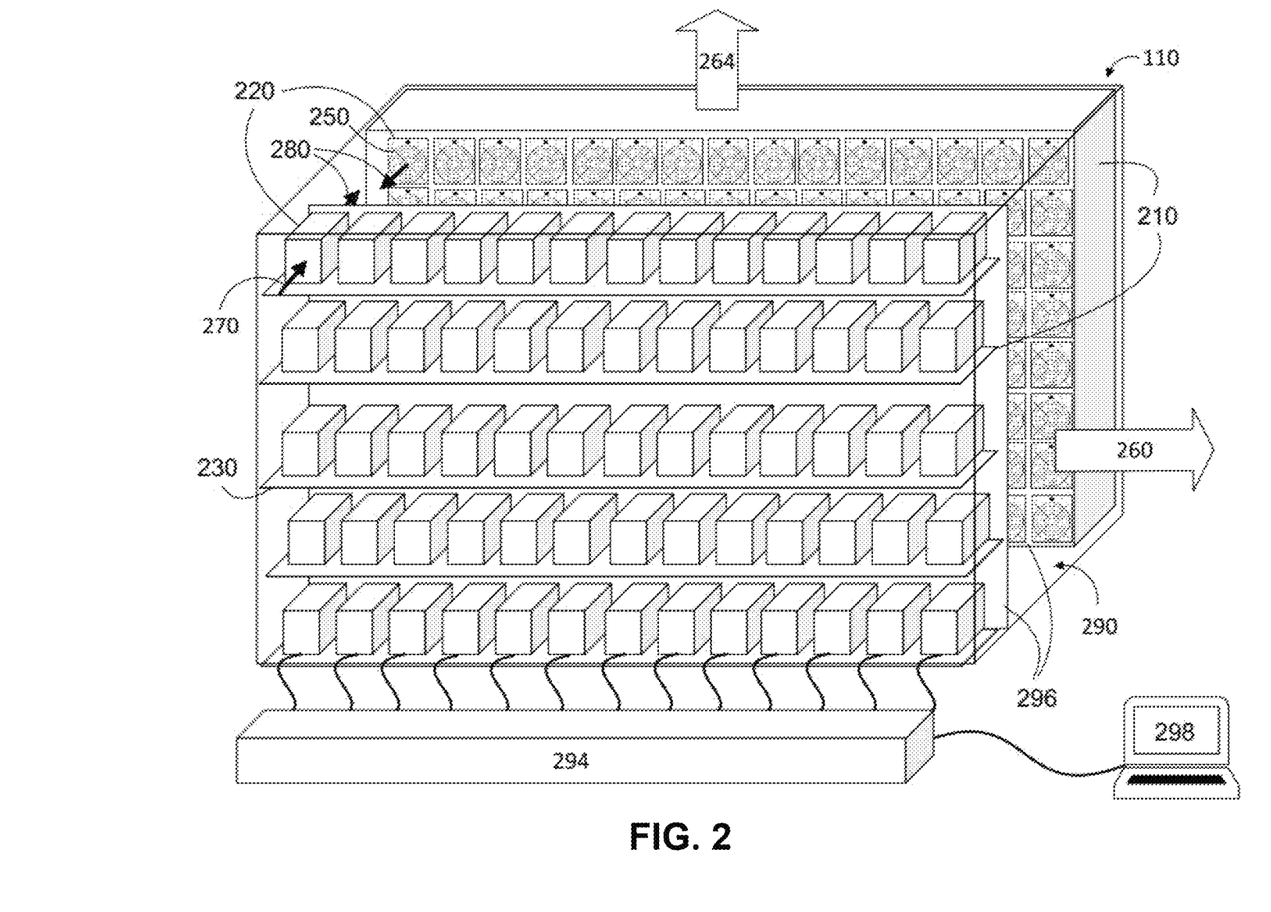
FIG. 2 is a diagram generally illustrating computing devices in a data center.

Turning now to FIG. 2, a perspective view of one example of a pod 110 is shown. This example of pod 110 has racks 210 that each have a number of shelves 230 for holding computing devices 220, thereby creating a two-dimensional array of computing devices on each rack or group of racks. In other embodiments, racks 210 may have rails that hold computing devices 220 in place of or in addition to shelves 230. Each computing device 220 has one or more cooling fans 250 configured to draw air from outside the pod into the computing device for cooling, as shown by arrow 270. The moving air draws heat from computing device 220 and is discharged from the computing device as shown by arrows 280.

In some embodiments, computing device 220 may have two fans, one on the intake side and one on the exhaust side. In other embodiments multiple smaller fans may be used within computing device 220 (e.g., next to each other working in parallel, or one behind the other working in series). Heated air is discharged by computing devices 220 into the space 290 between racks 210, often called a hot aisle. The space between racks 210 is typically sealed except for one or more exhaust openings through which the heated air exits. In some embodiments, these openings may be at the side, with heated air exiting as indicated by arrow 260. In other embodiments, these exhaust openings may be located at the top of hot aisle 290 with the heated air exiting above the pod as indicated by arrow 264. In some embodiments, computing devices 220 are positioned adjacent to an air barrier 296 with openings large enough to allow the heated exhaust air from each computing device 220 to pass into hot aisle 290 but not escape out of hot aisle 290 other than through the exhaust vents.

Computing devices 220 are networked together with network switch 294 and may be organized by mapping physical computing device positions within the pod, rack and shelf by the network ports on switch 294. This network connection allows management instructions and computing jobs to be sent to each computing device 220, and data such as device status information (e.g., temperature information, fan speed) and results of the computing jobs to be returned. Switch 294 may also be connected to other networks such as the internet, as well as a management controller 298 that is configured to execute a management application to manage computing devices 220. Management controller 298 may be a traditional PC or server, or specialized appliance. Management controller 298 may be configured with one or more processors, volatile memory and non-volatile memory such as flash storage or internal or external hard disk (e.g., network attached storage). The management application or module is preferably implemented in software (e.g., instructions stored on a non-volatile storage medium such as a hard disk, flash drive, or DVD-ROM), but hardware implementations are possible. Software implementations of the management application may be written in one or more programming languages or combinations thereof, including low-level or high-level languages, with examples including Java, Ruby, JavaScript, Python, C, C++, C#, or Rust. The program code may execute entirely on the management controller 298 as a stand-alone software package, partly on the management controller 298 and partly on a remote computer or computing devices 220, or entirely on a remote computer or computing devices 220.

In order to better cool computing devices 220, the management application may be configured to dispatch instructions to computing devices 220 to dynamically adjust their fan speeds (e.g., based on temperature information). While different computing devices will have different interfaces for setting fan speed, one example is that the computing device will have a network port open that will accept management commands such as setting the fan speed, voltage level, operating frequency, etc. The management application may provide a user interface for simplified management. For example, the management application may be configured to create a model of the data center based on device to port mappings and permit the user to specify a maximum setting (e.g., maximum fan setting), a minimum setting (e.g., minimum fan settings), and a type of fan speed pattern (e.g., linear gradient or cubic) across multiple computing devices. With this information, the management application may then automatically calculate the values (e.g., fan speed settings) for each computing device based on the distribution of the computing devices on the rack. In another embodiment, the management application may allow the user to manually override one or more of the settings for different computing devices or groups of computing devices. The management application may also prompt the user to specify timing and the direction for any desired shifts or rotations of the patterns.

While the illustrated examples show the computing devices 220 arranged in two-dimensional arrays that are planar and perpendicular to the floor, other arrangements are possible and contemplated. For example, the two-dimensional array may be sloped or angled relative to the floor (e.g., with each shelf angled and or offset from the one below it) and or non-planar (e.g., with each shelf angled and or offset from the one next to it).

Figure 3:
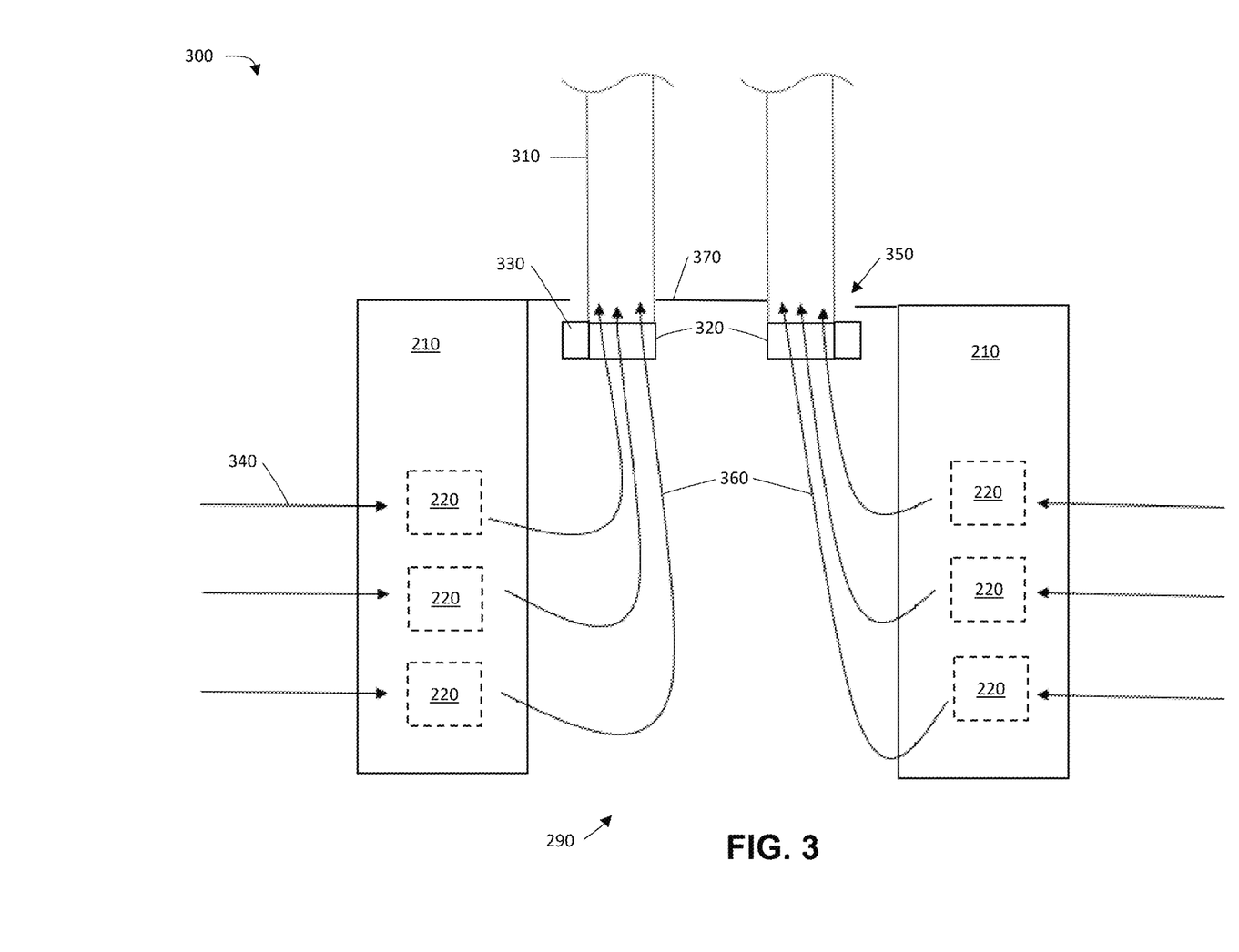
FIG. 3 is a diagram generally illustrating one example embodiment of a system for the reclamation of energy generated from computing devices according to the teachings of the present disclosure.

Turning now to FIG. 3, a diagram generally illustrating a front view of one example embodiment of a system 300 for the reclamation of energy generated from computing devices 220 according to the teachings of the present disclosure is shown. The system 300 may include at least one rack 210 comprising a plurality of computing devices 220, at least one exhaust duct 310, and at least one exhaust fan 320 coupled to a generator 330. The system 300 is depicted having two racks 210 that are positioned adjacent to one another and spaced apart by a distance defined by space 290.

With continued reference to FIG. 3, in some examples, the exhaust ducts 310 may be incorporated into the data center 100 and may be positioned above the racks 210. In other examples, the exhaust ducts 310 may be disposed to a side of the racks 210. As illustrated in FIG. 3, an exhaust fan 320 is removably coupled to each of the exhaust ducts 310. In some examples, the exhaust fan 320 may be coupled to an end of the exhaust duct 310 proximate the racks 210. In some configurations, the exhaust fan 320 may be disposed within the exhaust duct 310. The exhaust fan 320 may be a wind turbine. For example, when air passes through the exhaust duct 310, propeller-like blades of the exhaust fan 320 will rotate around a rotor (not depicted) causing the generator 330 to spin and thereby creating useable electricity. The exhaust fan 320 includes at least one propeller-like blade. While the system 300 is shown having two exhaust ducts and fans, it will be appreciated that the system 300 may include more or less than two exhaust ducts and fans within the scope of the present disclosure. Further, it will be appreciated that each exhaust duct is not required to include a fan within the scope of the present disclosure.

In the configuration illustrated in FIG. 3, the computing devices 220 take in cool air from outside of the racks 210 as indicated by arrows 340. The cool air passes through the computing devices 220, extracts waste heat, and is discharged into the space 290 between the racks 210. The large number of computing devices 220 all discharging heated air into the space 290 causes a buildup in pressure and drives out the heated air through one or more exhaust openings 350 that are located at the top of the racks 210 and through the exhaust ducts 310. This air flow is illustrated by arrows 360. In some configurations, the exhaust ducts 310 may be positioned adjacent to the exhaust opening 350. In other configurations, the exhaust ducts 310 may be positioned within the exhaust opening 350.

The space 290 between the racks 210 may be sealed by air barriers 370 such that the heated exhaust air can only escape through the opening 350 and cannot escape back into the cold aisle where the computing devices 220 draw in cold air. For example, the air barriers 370 may be structural foam sheets that are attached to the racks 210 (e.g., by being glued or screwed to the shelves 230) and are sealed to the adjacent air barriers to reduce leaks (e.g., with tape or caulking). The air barriers may be similarly sealed to the ceiling and floor of the data center to prevent hot air from escaping back into the cold aisle.

When the heated exhaust air travels through the exhaust fan 320 and into the exhaust duct 310, the blades of the fan will rotate causing the generator 330 to spin and create useable electricity. The amount of useable electricity generated will vary dependent upon the speed at which the blades rotate. Accordingly, the larger the amount of heat and air pressure discharged from the computing devices 220, the faster the blades will rotate, and the more electricity will be generated.

During operation, at least some of the electricity generated from the generator 330 can be useable by the data center 100. For example, the generator 330 may be capable of producing a voltage supply typically used by most electronic devices (e.g., 120 volts, 240 volts, etc.). It will be appreciated that the generator 330 may produce electricity within any applicable range within the scope of the present disclosure. This generated electricity may be capable of powering at least some of the computing devices 220 within the racks 210 or certain devices, components, and/or accessories of the data center (e.g., lights, electronic controllers, computers, etc.).

Figure 4:
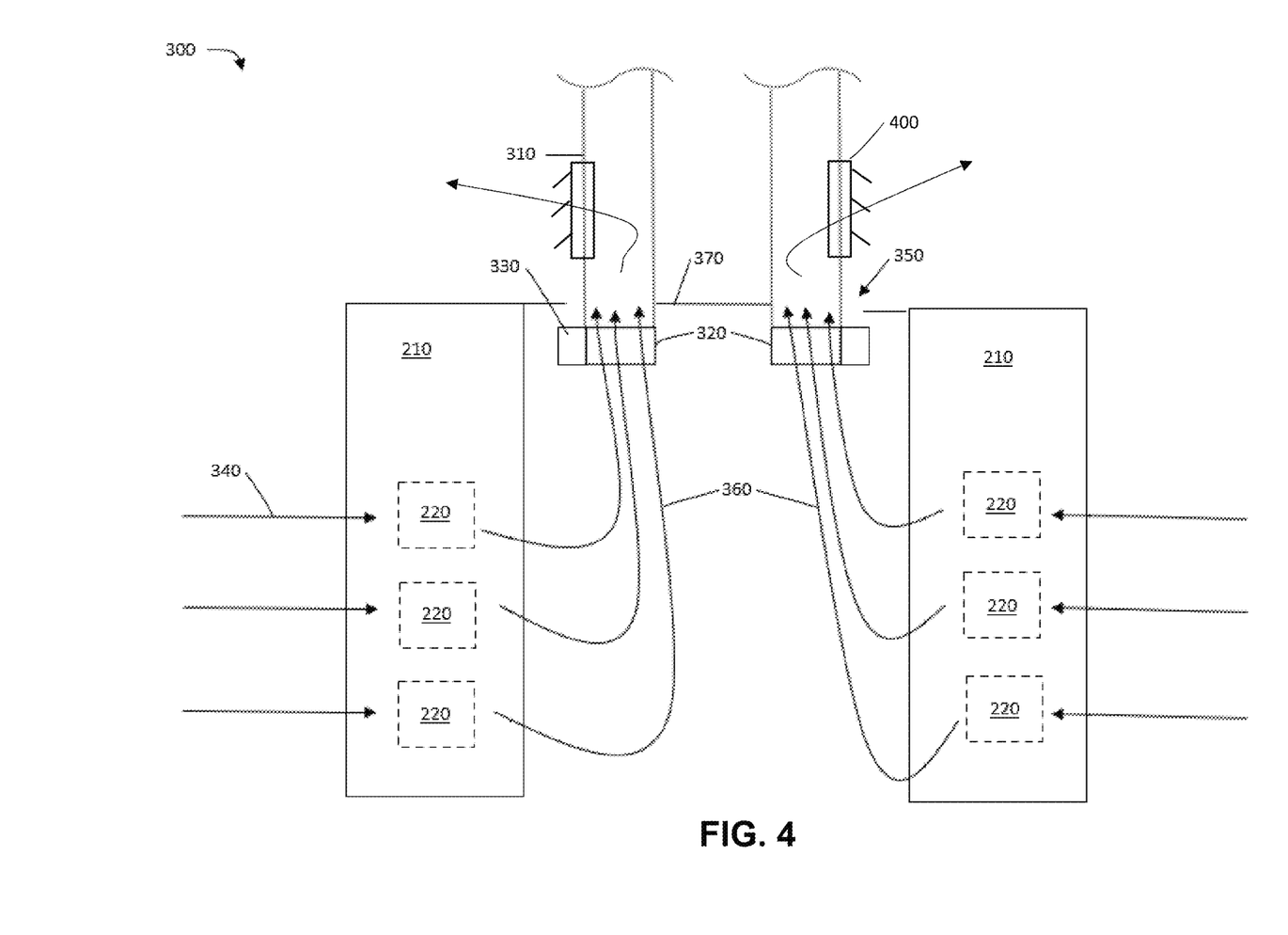
FIG. 4 is a diagram generally illustrating yet another example embodiment of a system for the reclamation of energy generated from computing devices according to the teachings of the present disclosure.

Turning now to FIG. 4, a diagram generally illustrating yet another example embodiment of a system 300 for the reclamation of energy generated from computing devices according to the teachings of the present disclosure is shown. In this embodiment, at least one exhaust duct 310 includes a damper 400. The damper 400 is disposed downstream from the exhaust fan 320. While the system 300 is shown having two dampers, it will be appreciated that the system 300 may include more or less than two dampers within the scope of the present disclosure. Further, it will be appreciated that each exhaust duct is not required to include a damper within the scope of the present disclosure.

In operation, the heated exhaust air entering the exhaust duct 310 will encounter the exhaust fan 320 before the damper 400. The damper 400 is a controllable device that regulates the airflow within the exhaust duct 310. For example, the damper 400 may be controlled by a defined temperature control sequence. During certain times throughout the year (e.g., the winter months) the ambient temperature within the data center 100 is cold. Thus, when the temperature of the data center reaches a predetermined threshold, the damper 400 is programmed to release a certain amount of hot exhaust air traveling through the exhaust duct 310, thereby raising the ambient temperature of the data center 100. The heated exhaust air released from the exhaust duct 310 may then be recirculated and mixed with incoming ambient air 340 before traveling through the computing devices 220.

Figure 5:
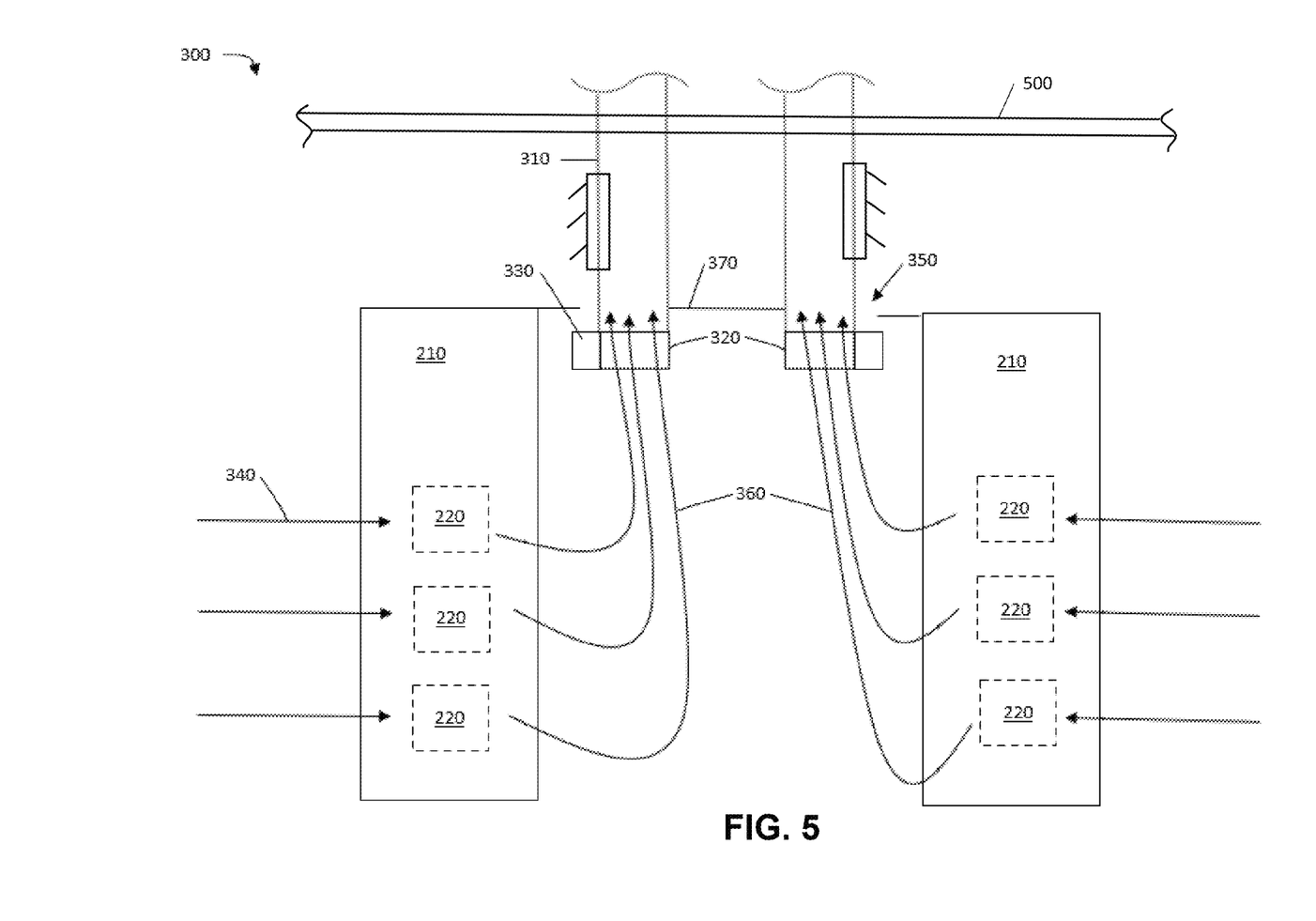
FIG. 5 is a diagram generally illustrating yet another example embodiment of a system for the reclamation of energy generated from computing devices according to the teachings of the present disclosure.

Turning now to FIG. 5, a diagram generally illustrating still another example embodiment of a system 300 for the reclamation of energy generated from computing devices according to the teaching of the present disclosure is shown, in this embodiment, data center pipes 500 are positioned running through the exhaust ducts 310. The pipes 500 may contain fluid (e.g., air, water, coolant, etc.) that are a part of the data center's HVAC system. In operation, the heated exhaust traveling through the exhaust ducts 310 will encounter the pipes 500 and heat the fluid disposed within. This configuration may help heat the data center 100 as desired.

In some configurations, the system 300 includes sensors (not depicted) disposed throughout the data center 100 that continuously monitor pressure and temperature of the data center 100. For example, the air pressure and temperature of the air entering and exiting the computing devices 220 is monitored. Also, the environmental conditions of the data center 100 are monitored. In operation, the system 300 is configured to control the exhaust fans 320, the generators 330, and the dampers 400 in connection so that desired predetermined airflow and environment conditions are meet and maintained.

Reference throughout the specification to "various embodiments," "with embodiments," "in embodiments," or "an embodiment," or the like, means that a particular feature, structure, or characteristic described in connection with the embodiment is included in at least one embodiment. Thus, appearances of the phrases "in various embodiments," "with embodiments," "in embodiments," or "an embodiment," or the like, in places throughout the specification are not necessarily all referring to the same embodiment. Furthermore, the particular features, structures, or characteristics may be combined in any suitable manner in one or more embodiments. Thus, the particular features, structures, or characteristics illustrated or described in connection with one embodiment/example may be combined, in whole or in part, with the features, structures, functions, and/or characteristics of one or more other embodiments/examples without limitation given that such combination is not illogical or non-functional. Moreover, many modifications may be made to adapt a particular situation or material to the teachings of the present disclosure without departing from the scope thereof.

It should be understood that references to a single element are not necessarily so limited and may include one or more of such elements. Any directional references (e.g., plus, minus, upper, lower, upward, downward, left, right, leftward, rightward, top, bottom, above, below, vertical, horizontal, clockwise, and counterclockwise) are only used for identification purposes to aid the reader's understanding of the present disclosure, and do not create limitations, particularly as to the position, orientation, or use of embodiments.

Joinder references (e.g., attached, coupled, connected, and the like) are to be construed broadly and may include intermediate members between a connection of elements and relative movement between elements. As such, joinder references do not necessarily imply that two elements are directly connected/coupled and in fixed relation to each other. The use of "e.g." and "for example" in the specification is to be construed broadly and is used to provide non-limiting examples of embodiments of the disclosure, and the disclosure is not limited to such examples. Uses of "and" and "or" are to be construed broadly (e.g., to be treated as "and/or"). For example, and without limitation, uses of "and" do not necessarily require all elements or features listed, and uses of "or" are inclusive unless such a construction would be illogical.

While processes, systems, and methods may be described herein in connection with one or more steps in a particular sequence, it should be understood that such methods may be practiced with the steps in a different order, with certain steps performed simultaneously, with additional steps, and/or with certain described steps omitted.

All matter contained in the above description or shown in the accompanying drawings shall be interpreted as illustrative only and not limiting. Changes in detail or structure may be made without departing from the present disclosure.

It should be understood that a computer, a system, and/or a processor as described herein may include a conventional processing apparatus known in the art, which may be capable of executing preprogrammed instructions stored in an associated memory, all performing in accordance with the functionality described herein. To the extent that the methods described herein are embodied in software, the resulting software can be stored in an associated memory and can also constitute means for performing such methods. Such a system or processor may further be of the type having ROM, RAM, RAM and ROM, and/or a combination of non-volatile and volatile memory so that any software may be stored and yet allow storage and processing of dynamically produced data and/or signals.

It should be further understood that an article of manufacture in accordance with this disclosure may include a non-transitory computer-readable storage medium having a computer program encoded thereon for implementing logic and other functionality described herein. The computer program may include code to perform one or more of the methods disclosed herein. Such embodiments may be configured to execute via one or more processors, such as multiple processors that are integrated into a single system or are distributed over and connected together through a communications network, and the communications network may be wired and/or wireless. Code for implementing one or more of the features described in connection with one or more embodiments may, when executed by a processor, cause a plurality of transistors to change from a first state to a second state. A specific pattern of change (e.g., which transistors change state and which transistors do not), may be dictated, at least partially, by the logic and/or code.

What is claimed is:

1. A system for the reclamation of energy generated from computing devices disposed within a data center, the system comprising:
   at least one rack including a plurality of shelves and a plurality of computing devices;
   an exhaust duct disposed adjacent to the at least one rack, the exhaust duct configured to receive exhaust air from the computing devices;
   a damper disposed within the exhaust duct and configured to release at least some of the exhaust air into the data center when an ambient temperature of the data center reaches a predetermined threshold;
   an exhaust fan coupled externally to an end of the exhaust duct proximate the at least one rack and configured to encounter the exhaust air that passes through the exhaust duct, wherein the damper is disposed downstream of the exhaust fan;
   an air barrier attached to the at least one rack on an exhaust side of the plurality of computing devices, the air barrier structured and arranged to span the plurality of shelves adjacent to the plurality of computing devices; and
   a management controller configured to create a model of the data center based on device to port mappings to provide management of the data center via the plurality of computing devices based at least in part on fan inputs received from a user interface.

2. The system of claim 1, wherein the exhaust duct is disposed above the at least one rack.

3. The system of claim 1, wherein the exhaust duct is disposed to a side of the at least one rack.

4. The system of claim 1, wherein a data center HVAC pipe is positioned through the exhaust duct and is configured to be heated by the exhaust air.

5. The system of claim 1, wherein the exhaust fan is coupled to the exhaust duct and a generator, the generator configured to generate electricity when the exhaust air from the computing devices encounters the exhaust fan.

6. The system of claim 1, further comprising a second air barrier attached at an end of the at least one rack on the exhaust side of the plurality of computing devices.

7. The system of claim 1, wherein the damper is controlled by a defined temperature control sequence.

8. The system of claim 1 further comprising at least one exhaust opening disposed at a top of the at least rack, wherein the exhaust duct is positioned adjacent to exhaust opening.

9. The system of claim 1 wherein the exhaust fan is removably coupled to the exhaust duct.

10. A system for the reclamation of energy generated from computing devices, the system comprising:
   at least one rack including a plurality of computing devices configured to exhaust air into a hot aisle;
   an exhaust duct communicating with the hot aisle of the at least one rack, the exhaust duct configured to receive exhaust air from the plurality of computing devices;
   at least one exhaust opening disposed at a top of the at least rack, wherein the exhaust duct is positioned adjacent to the exhaust opening;
   an exhaust fan removably coupled externally to the exhaust duct and coupled to a generator, the generator configured to generate electricity when the exhaust air from the computing devices encounters the exhaust fan;
   wherein the exhaust duct includes a damper configured to release at least some of the exhaust air into the data center when the ambient temperature of the data center reaches a predetermined threshold, and wherein the damper is disposed downstream from the exhaust fan;
   an air barrier attached to the at least one rack on an exhaust side of the plurality of computing devices, the air barrier structured and arranged to permit exhaust air to pass into the hot aisle and block exhaust air from escaping out of the hot aisle other than through the exhaust duct; and
   a management controller configured to create a model of the data center based on device to port mappings to provide management of the data center via the plurality of computing devices based at least in part on fan inputs received from a user interface.

11. The system of claim 10, wherein the system is disposed within a data center having an ambient temperature.

12. The system of claim 11, wherein a data center HVAC pipe is positioned through the exhaust duct and is configured to be heated by the exhaust air.

13. The system of claim 10, wherein the exhaust duct is disposed above the at least one rack.

14. The system of claim 10, wherein the exhaust duct is disposed to a side of the at least one rack.

15. The system of claim 10, wherein the exhaust fan is disposed at an end of the exhaust duct proximate the at least one rack.

16. The system of claim 10, further comprising a second air barrier attached at an end of the at least one rack on the exhaust side of the plurality of computing devices.

17. The system of claim 16, wherein the air barrier comprises a structural foam sheet.

* * * * *